United States Patent [19]

Fink

[11] Patent Number: 4,804,909

[45] Date of Patent: Feb. 14, 1989

[54] ATTO-AMPEREMETER

[75] Inventor: Hans-Werner Fink, Richterswil, Switzerland

[73] Assignee: International Business Machines Corporation, Armonk, N.Y.

[21] Appl. No.: 174,477

[22] Filed: Mar. 28, 1988

[30] Foreign Application Priority Data

Sep. 11, 1987 [EP] European Pat. Off. ........... 87113324

[51] Int. Cl.$^4$ ...................... G01R 19/18; G01R 1/30; G01N 27/00
[52] U.S. Cl. .................... 324/120; 324/122; 324/123 R; 324/71.4
[58] Field of Search ................ 324/158 R, 71.4, 71.3, 324/451, 123 R, 122, 455; 313/103 CM, 105 CM

[56] References Cited

U.S. PATENT DOCUMENTS

| 3,321,628 | 5/1967 | Webb | 324/123 R |
| 3,368,148 | 2/1968 | Stut | 324/64 |
| 3,679,973 | 7/1972 | Smith, Jr. et al. | 324/71.4 |
| 3,752,987 | 8/1973 | Tosswill | 313/103 CM X |
| 3,790,840 | 2/1974 | Toyoda | 313/105 CM X |
| 3,808,494 | 4/1974 | Hayashi et al. | 313/103 |
| 4,335,304 | 6/1982 | Palmberg | 250/207 |
| 4,691,160 | 9/1987 | Ino | 324/71.3 X |

FOREIGN PATENT DOCUMENTS 0027517 4/1981 European Pat. Off. .

OTHER PUBLICATIONS

H. Hubner, "First Results of a Microwave Field Emission Cathode", Optik, vol. 64, No. 2, May 1983, pp. 113–123.
Fink, H., "Mono-Atomic Tips for Scanning Tunneling Microscopy," IBM Journal of Research and Development, vol. 30, No. 5, pp. 460–465 (Sep. 1986).
Kurz, E. A., "Channel Electron Multipliers," American Laboratory (Mar. 1979).

Primary Examiner—Reinhard J. Eisenzopf
Assistant Examiner—Vinh P. Nguyen
Attorney, Agent, or Firm—Marc D. Schechter

[57] ABSTRACT

An atto amperemeter includes a shop tip (1) correctable to a voltage source (18) providing a known potential (U') via a sample conductor measured, the tip (1) faces a particle detector such as an electron multiplier (4). The count of the free electrons being emitted from the tip (1), multiplied by the electron multiplier (4) and counted by an electronic current (i) passing through the sample conductor (17). Calibration of the arrangement is performed by temporarily connecting the tip (1) to ground and applying a calibration potential (U cal) to a calibrated electrode (3) aligned with the tip (1) and the channel electron multiplier (4).

11 Claims, 1 Drawing Sheet

ATTO-AMPEREMETER

BACKGROUND OF THE INVENTION

This invention relates to amperemeters capable of measuring currents on the order of $10^{-18}$ A. There is a definite need to measure currents in the atto-ampere range both in the scientific environment and in industrial applications. With the steadily increasing microminiaturization of electronic circuits, the currents flowing in these devices have of necessity become smaller and smaller, and have now reached the sensitivity of state-of-the-art current measurement equipment.

With conventional analog current meters, measurable currents are limited to some $10^{-13}$ A owing to the finite resistance to ground of these instruments. Also, the smaller the currents to be measured, the longer become the measuring times, and in turn, long measuring times invite noise from various sources to affect the result of the measurement.

Examples of conventional current meters for the measurement of very small currents are the galvanometer and the electrometer. The galvanometer employs the magnetic effect an electrical current produces when flowing in a conductor. This effect manifests itself as a torque exerted between the conductor and a magnet. Observation is often made by a light beam reflected in a mirror attached to the moving part. For very small currents, the force generated is on the order of the friction in the system and, thus, cannot yield reliable results.

An electrometer detects the voltage across a very large resistance, a shunt. For example, in a vacuum tube electrometer, the current is passed through a resistor of $10^{10}$ Ω or higher, and the voltage drop across that resistance is then amplified. The problem here is the thermal noise which cannot be sufficiently eliminated.

SUMMARY OF THE INVENTION

Therefore, it is one object of the present invention to propose a simple device for measuring very small electric currents, which does not have the disadvantages of the prior art measurement equipment. The amperemeter of the present invention is designed on the basis of the conversion of the low device currents into free electrons which can be counted with a sensitivity that is at least three orders of magnitude higher than the sensitivity of conventional equipment, and which profits from the high speed of present-day counting electronics.

For the purposes of this description, the term 'free electrons' shall refer to electrons not restrained to remain in the immediate neighborhood of a nucleus or of an atom but which can overcome the work function of their host material and enter into the free space of a contained vacuum.

Accordingly, the present invention relates to an atto-amperemeter comprising means for converting a current of electrons to be measured and flowing through a sample conductor, to free electrons, this atto-amperemeter being characterized by a sharply pointed tip facing a particle detector, the tip a being connectable via said sample conductor to a first source of potential ($U_1$) to cause it to become charged from its originally floating potential to a second potential ($U_2$) being the difference of said first potential ($U_1$) minus the voltage drop ($\Delta U$) occurring across the sample conductor. The second potential ($U_2$) determines, together with the emission characteristics of said tip, the number of free electrons which are emitted from said tip. The free electrons are multiplied by the particle detector to produce pulses of multiple electrons. The pulses are counted by an electronic counter connected to the output of the particle detector. The pulse count per second of the electronic counter is a measure of the current to be measured and passing through said sample conductor.

BRIEF DESCRIPTION OF THE DRAWING

Details of two embodiments of the invention will hereafter be described by way of example with reference to the attached drawings in which.

DESCRIPTION OF THE PREFERRED EMBODIMENTS

Figure 1:
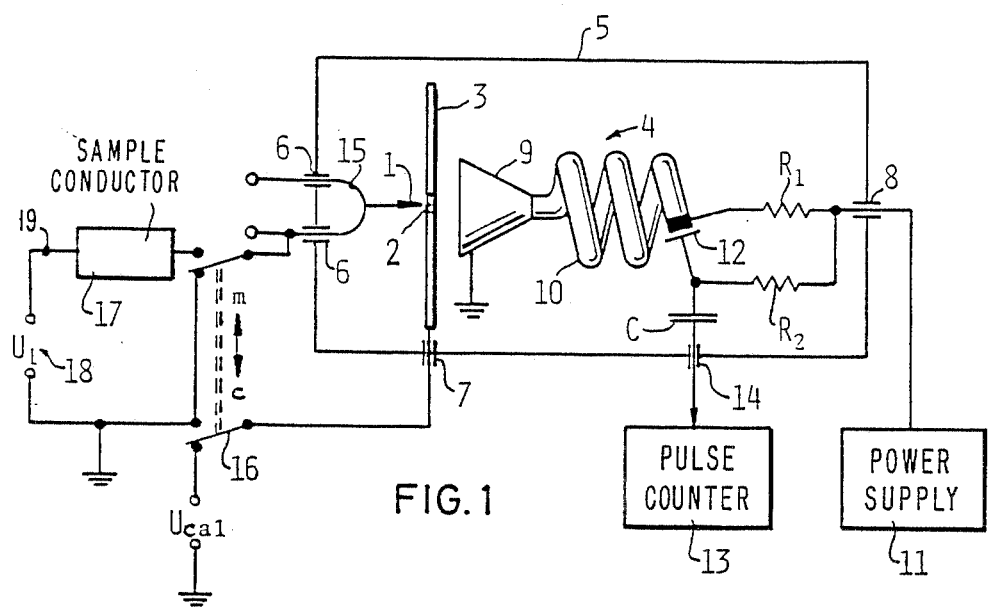
FIG. 1 is a schematic diagram showing the basic components of an atto-amperemeter in accordance with the invention.

Referring to FIG. 1, an ultra-sharp tip 1 is arranged in line with an opening 2 in an electrode 3. Also aligned with tip 1 and opening 2 is a particle detector 4. Tip 1 may, for example, consist of a very sharply pointed tungsten whisker ending in a single atom at its apex. Tip 1 may or may not be operated as a field emission tip. It may also operate in a tunneling mode. Particle detector 4 may, for example, take the form of a conventional channel electron multiplier. Tip 1, electrode 3 and particle detector (channel electron multiplier) 4 are placed inside a vessel 5 under ultra-high vacuum, all having appropriate feedthroughs 6, 7 and 8 for their connection to electronic circuitry outside vessel 5.

Electron multiplier 4 may be of conventional design like the commercially available channeltron or consist of a phosphor screen followed by a photomultiplier. Usually, a cone-shaped input aperture 9 is connected to a straight or curved tube 10 the inner wall of which is coated with a suitably resistive and secondary emissive material, such as a semiconductor layer. Between the ends of the channel a potential of several thousand volts is applied.

In operation, in a channel electron multiplier, an electron incident upon the interior surface of tube 10 causes the emission of at least one secondary electron. This secondary electron is accelerated by the electrostatic field within tube 10 until it hits the interior surface thereof. Assuming it has accumulated enough energy from the field, this electron, in turn, will cause more than one secondary electron to be released. This process, after having occured 10 to 20 times, will result in a gain of about $10^4$. If tube 10 is appropriately curved, a gain even in excess of $10^8$ may be achieved. In other words, each impinging electron will cause a pulse of $10^8$ electrons to appear at the output of channel electron multiplier 4, the pulse having a width of approximately 20 ns.

The output pulse of the channel electron multiplier is obtained at the far end of tube 10. Depending on the particular design of the multiplier used, the signal may be collected either at a metal cap fastened directly to the output end of the multiplier or at a metal disk placed at a small distance from the rear end of the multiplier. In FIG. 1, the latter design is shown. A high-voltage power supply 11 is connected via feedthrough 8 to a resistor network comprising a first resistor $R_1$ which supplies the operating voltage to the channel electron multiplier, and a second resistor $R_2$ which provides a bias voltage to disk 12 at the end of the multiplier. An electronic pulse counter 13 is connected to disk 12 via a capacitor C which serves to disconnect the high voltage from the counter, passing a feedthrough 14.

Proper values for the resistors $R_1$ and $R_2$ and for capacitor C can be determined as follows: Resistor $R_1$ is in series with channel electron multiplier 4, and together they act as a voltage divider. Resistor $R_1$ should be chosen such that the voltage drop across it is approximately 100 V. Thus, a potential difference of 100 V is created between the end of the channel electron multiplier and anode disk 12 to accelerate the electrons out of the multiplier toward the anode where they are collected.

If a shielded coaxial cable is used to transfer the pulses from vacuum vessel 5 to pulse counter 13, the impedance of capacitor C should be chosen to be low in comparison with the characteristic impedance of the cable, such that capacitor C may act as a small resistor in series with the cable and will not seriously reduce the voltage seen by counter 13. The capacitor should have a frequency response that will allow passage of individual pulses to pulse counter 13 without severe distortion. Generally, capacitor C should be dimensioned such that it can pass frequencies that are at least ten times higher than the maximum expected count rate.

For example, assuming a maximum count rate of 0.5 MHz, and a 0 Ω coaxial cable, the impedance $x_c$ of capacitor C would be sufficiently small at 2 Ω, and the capacitor should be able to handle a count rate of 5 MHz. With $x_c = 1/2\pi fC$, one finds the value for C to be 0.016 μF.

Resistor $R_2$ is parallel to the signal load. If $R_2$ is chosen very large, the RC time constant of the network will be large, and the electron flow through $R_2$ be severely restricted. At some high count rates, the potential at disk 12 may be insufficient to attract all of the electrons from the output of the channel electron multiplier. Usually, resistor $R_2$ should have a value between 1 kΩ and 1 MΩ for reliable operation.

Still referring to FIG. 1, tip 1 is shown attached to a filament 15 which permits heating of tip 1 for cleaning and sharpening procedures. Filament 15, and with its tip 1, is connected to a switch 16 which permits switching of tip 1 between ground potential and the output terminal of the device (sample conductor) 17 to be measured. Device 17, in turn, is connected to a known voltage source 18 supplying the potential $U_1$.

In addition to measuring currents on the order of $10^{-18}$ A, the apparatus according to the invention can also measure voltages. Empirical voltage measurements can be made by determining the current-voltage (I-V) characteristics of the apparatus prior to measurement, then measuring a current and inferring the measured voltage from the measured current.

For the calibration of tip 1, i.e. for determining its I-V characteristics, switch 16 is placed in position c, a varying calibration potential $U_{cal}$ of up to 200 V is applied to electrode 3 and, if a channel electron multiplier was chosen, a channel voltage of about 3.5 kV is applied to the appropriate terminal of electron multiplier 4.

Now the I-V characteristics of the atto-amperemeter can be determined so as to associate the observed count rates, i.e. the number of electrons entering electron multiplier 4, with the potential $U_{cal}$ applied to electrode 3.

With switch 16 thereupon placed in position m, the measurement can be performed. The potential $U_1$ of voltage source 18 is applied between ground and terminal 19 of device 17, thereby charging device 17 up to the potential $U_1$ until electrons start leaving tip 1. These free electrons must pass through device 17 and thus cause a voltage drop ΔU thereacross. Their number is a measure for the current through device 17.

The mechanism responsible for the conversion of the electrons flowing through device 17 and appearing at the apex of tip 1, into free electrons is known as field-emission. The conduction electrons in the metal tip 1 are confined therein by the surface potential barrier the shape of which is determined by the potential inside the tip, the image force and the applied external field. Electrons can tunnel through the surface potential barrier when the external field is sufficiently strong. This is obviously the case where, as in the arrangement being described, the electric field exists between the sharply pointed tip 1 and the counter electrode 3.

The atto-amperemeter of the present invention can be better understood from a couple of useful parameters. Preferably but not necessarily, tip 1 should be made as sharp as possible. For example, the tip's apex may consist of one single atom. A technique to manufacture mono-atomic tips has been described by H.W. Fink in an article entitled "Mono-atomic tips for scanning tunneling microscopy" (*IBM Journ. of Research & Development,* Vol. 30, No.5, Sept. 1986, pp. 460-465). Briefly, an individual atom is deposited from the gas phase on a trimer of atoms at the apex of pyramidal (111)-oriented tungsten tip. With the tip fixed at a distance of about one millimeter from electrode 3, and by varying the potential at the electrode 3 between 100 and 200 volts for calibration purposes, an electric field strength on the order of $2 \times 10^7$ V/cm will result. Depending on the actual value of the potential at electrode 3, between 1 and $10^6$ electrons per second will be leaving tip 1 and get accelerated through the hole in electrode 3 to fly to the detector 4. In special cases, the count rate may be as low as one electron in five seconds. But at such low count rates, the effects of several noise sources may again become a problem, such as the cosmic rays, photons or γ-quants.

For tips with a radius of less than 5 nm, the current should never exceed 10 μA at a voltage of 200 V, lest the tip should start melting.

Figure 2:
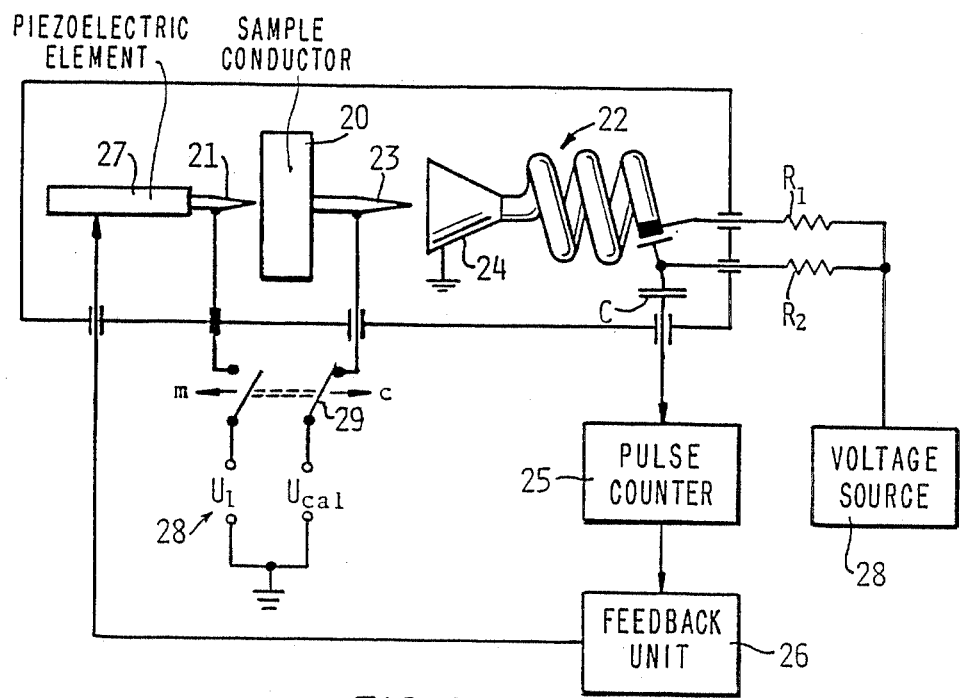
FIG. 2 is a schematic diagram of an atto-amperemeter employing a tunneling microscope.

FIG. 2 shows an alternative embodiment of the atto-amperemeter in accordance with the invention. The sample conductor 20, the current through which is to be measured, is arranged between a tunnel tip 21 and an electron multiplier 22. Sample 20 carries a field-emission tip 23 on its side facing multiplier 22, as shown in FIG. 2. A potential $U_1$ from a voltage source 28 is applied to tunnel tip 21. With sample 20 at tunneling distance, i.e. less than 1 nm, from sample 20, a tunneling current will flow charging sample 20 from its originally floating potential towards the potential $U_1$ until electrons start to be emitted from field-emission tip 23 and enter the cone 24 of multiplier 22.

The flow of electrons through sample 20 causes the potential at field-emission tip 23 to assume a potential $U_2 = U_1 - \Delta U$, with ΔU being the voltage drop across sample 20. The free electrons entering multiplier 22 get amplified as described before and counted by an electronic counter 25. A feedback unit 26 permits the calibration of field-emission tip 23 in that it regulates the distance between tunneling tip 21 and the surface of sample 20 in accordance with predetermined count rates. This distance can be controlled by a conventional piezoelectric element 27.

The calibration of the atto-amperemeter of FIG. 2 is performed by applying a variable calibration voltage $V_{cal}$ to field-emission tip 23 by means of a switch 29, to determine the I-V characteristics of the tip/multiplier assembly, i.e. to associate the potential at tip 23 with the count rate obtained from channel electron multiplier 22.

I claim:

1. Atto-amperemeter comprising means for converting a current of electrons to be measured and flowing through a sample conductor, to free electrons, characterized by a sharply pointed tip (1, 23) facing a particle detector (4, 22), the tip (1, 23) is connected via said sample conductor (17, 20) to a first source of potential ($U_1$; 18, 28) to cause it to become charged from its originally floating potential to a second potential ($U_2$) being the difference of said first potential ($U_1$) minus the voltage drop ($\Delta U$) occurring across the sample conductor (17, 20), said second potential ($U_2$) determining, together with the emission characteristics of said tip (1, 23), the number of free electrons which are emitted from said tip (1, 23), and which get multiplied by said particle detector (4, 22) to produce pulses of multiple electrons, said pulses being counted by an electronic counter (13, 25) connected to the output of said particle detector (4, 22), the count of said electronic counter (13, 25) being a measure for the current passing through said sample conductor (17, 20).

2. Atto-amperemeter in accordance with claim 1, characterized in that the particle detector is designed as an electron multiplier (4, 22) and that said sharply pointed tip (1, 23) is arranged in alignment with an entrance cone (9, 24) of said electron multiplier (4, 22).

3. Atto-amperemeter in accordance with claim 1 or 2, characterized in that said tip (1, 23) consists of a tungsten whisker having a single atom sitting on a trimer of atoms at the apex thereof.

4. Atto-amperemeter in accordance with claim 1 or 2, characterized in that a switch (16, 29) is provided to permit switching of the tip (1, 23) between calibration and measurement positions (c, m) and to apply a calibration potential ($U_{cal}$) so as to permit, during a calibration operation, the determination of the I-V characteristics of the tip/particle detector arrangement (1, 23; 4, 22).

5. Atto-amperemeter in accordance with claim 4, characterized in that said switch (16) is arranged to connect said tip (1) to ground and said electrode (3) to said calibration potential ($U_{cal}$) when said switch (16) is in its calibration position (c), and to connect said tip (1) to said sample conductor (17) and said electrode (3) to ground when said switch (16) is in its measurement position (m).

6. Atto-amperemeter in accordance with claim 1, characterized in that said tip (23) is mounted on one side of said sample conductor (20) and that a tunneling tip (21) is supported facing the opposite side of said sample conductor (20) with its apex being maintained at tunneling distance from the surface of said opposite side of the sample conductor (20), said tunneling distance being adjustable by means of a piezoelectric element (27) attached to said tunneling tip (21).

7. Atto-amperemeter in accordance with claim 4 and characterized in that said tip (23) is mounted on one side of said sample conductor (20) and that a tunneling tip (21) is supported facing the opposite side of said sample conductor (20) with its apex being maintained at tunneling distance from the surface of said opposite side of the sample conductor (20), said tunneling distance being adjustable by means of a piezoelectric element (27) attached to said tunneling tip (21), and further, characterized in that said switch (29) is arranged to connect said tip (23) to said calibration potential ($U_{cal}$) when in its calibration position (c), and to connect said tunneling tip (21) to said first potential ($U_1$) when in its measurement position (m).

8. Atto-amperemeter in accordance with claim 6, characterized in that said electronic counter (25) is connected to the input of a feedback unit (26) the output of which is connected to said piezoelectric element (27) to permit control of the tunneling distance between said tunneling tip (21) and the surface of the sample conductor (20).

9. Atto-amperemeter in accordance with claim 1, characterized in that said tip (1) is mounted to a filament (15) permitting the heating of said tip (1) for cleaning and sharpening procedures.

10. Atto-amperemeter in accordance with claim 2, characterized in that said electron multiplier (4) is designed as a channel electron multiplier, and that said tip (1, 23) is a field-emission tip.

11. An atto-amperemeter comprising:
means for converting a current of electrons to be measured into free electrons, said current conversion means comprising a sharply pointed tip for emitting the free electrons;
a particle detector facing the tip, said particle detector being arranged to receive the free electrons emitted from the tip, said particle detector producing a pulse of multiple electrons for each free electron emitted from the tip; and
means for counting the number of pulses per second produced by the particle detector.

* * * * *